United States Patent
Bachman et al.

[11] Patent Number: 5,923,531
[45] Date of Patent: Jul. 13, 1999

[54] ENHANCED CIRCUIT BOARD ARRANGEMENT FOR A COMPUTER

[75] Inventors: Wesley H. Bachman, Rochester; Douglas A. Baska, Oronoco; Matthew Allen Butterbaugh; Sukhvinder Singh Kang, both of Rochester; Kenneth Edward Lubahn, Byron; Brian Scott Mullenbach; Kevin Robert Qualters, both of Rochester, all of Minn.

[73] Assignee: International Business Machines Corporation, Armonk, N.Y.

[21] Appl. No.: 08/950,370

[22] Filed: Oct. 14, 1997

[51] Int. Cl.⁶ ..................................................... H05K 7/20
[52] U.S. Cl. .......................... 361/690; 361/707; 361/752; 361/695; 174/252; 174/16.3; 165/80.3
[58] Field of Search .................................... 361/683, 684, 361/687, 690, 693, 694, 695, 686, 688, 702, 704, 706, 796, 685, 707–712; 257/712, 706; 165/80.3, 80.4, 906, 46, 104.33, 34, 165, 104.32; 439/61, 347, 74, 75, 485, 908; 236/49; 174/16.3

[56] References Cited

U.S. PATENT DOCUMENTS

| | | | |
|---|---|---|---|
| 4,126,269 | 11/1978 | Bruges | 236/49 |
| 4,672,509 | 6/1987 | Speraw | 361/384 |
| 4,739,444 | 4/1988 | Zushi et al. | 361/383 |
| 4,894,749 | 1/1990 | Elko et al. | 361/383 |
| 4,911,645 | 3/1990 | August et al. | 439/75 |
| 5,023,754 | 6/1991 | Aug et al. | 361/415 |
| 5,210,680 | 5/1993 | Scheibler | 361/384 |
| 5,343,359 | 8/1994 | Morton et al. | 361/707 |
| 5,594,621 | 1/1997 | Rumpt | 361/686 |

*Primary Examiner*—Leo P. Picard
*Assistant Examiner*—Michael Datskovsky
*Attorney, Agent, or Firm*—Robert H. Berdo, Jr.

[57] ABSTRACT

A computer arrangement includes an electronics enclosure located within a computer housing, which is divided into a plurality of physically separated cooling zones. The enclosure has a plurality of inlet and outlet openings. Each cooling zone is in registration with respective inlet and outlet openings. A backplane is disposed within the electronics enclosure, and has front and rear surfaces. A first electrical component is attached to one of the surfaces and is arranged in one of the cooling zones. At least one circuit board is disposed within the electronics enclosure and is attached to the front surface of the backplane. The circuit board has a second electrical component attached to a surface thereof, which is arranged in another one of the cooling zones. A system operation card is disposed within the electronics enclosure, and is attached to the rear surface of the backplane. A gas moving device is located outside of the electronics enclosure, and is activatable to cause a cooling gas to flow through the cooling zones. The inlet and outlet openings are sized so that the cooling zones receive only an amount of cooling gas necessary to cool the respective electrical components located therein.

6 Claims, 9 Drawing Sheets

ENHANCED CIRCUIT BOARD ARRANGEMENT FOR A COMPUTER

CROSS-REFERENCE TO RELATED PATENT APPLICATIONS

The subject matter of this application is related to application Ser. No. 08/949,452, filed Oct. 14, 1995, entitled "BI-DIRECTIONAL COOLING ARRANGEMENT FOR USE WITH AN ELECTRONIC COMPONENT ENCLOSURE" by Sukvinder S. Kang et al., attorney docket number IBM-106.

BACKGROUND OF THE INVENTION

1. Field of the Invention

The invention relates to an enhanced circuit board arrangement for a computer, such as a deskside personal computer, for example, and in particular, to an enhanced arrangement of a backplane, processor cards, memory cards, and clock card within a cage.

2. Background Information

Backplanes are wiring boards used in computers, and are typically provided with card slots or plugs for various circuit boards, such as a processor card and a so-called memory riser card, attached to a common surface of the backplane in the card slots or to the plugs. Further, it is typical to permanently attach a clock card, which is a further type of circuit board, to the common surface of the backplane. This assembly of the backplane and various circuit boards may be positioned within an open cage, which is a frame fixed within a computer housing. The cage serves to position the circuit boards within the computer housing.

It has generally been believed that each of the cards attached to the backplane needs to remain accessible for service or modification. As such, the number of cards that can be attached to the backplane has been limited by the front surface area of the backplane. As the processing and/or memory requirements of computers have increased, the required surface area of the backplane has likewise increased a corresponding amount to accommodate extra processor and/or memory riser cards, for example. However, the backplane is a relatively expensive computer component, and represents a significant portion of the total production cost of a computer system. As the size of the backplane is increased, the cost of the backplane disadvantageously increases a proportional amount, thereby increasing the production cost of an associated computer system. Therefore, a need exists for a way to satisfy the expanding needs for greater computer system processing power and/or memory capacity while keeping backplane costs under control.

Typical memory riser cards are provided with a plurality of removable Dual In-Line Memory Modules (DIMMs), which can be inserted into electrical slots provided on a surface of the cards. Further, the memory riser cards are typically provided in a commercial system with empty electrical slots, which can receive additional DIMMs as the computer memory needs of the user increase. However, the electrical terminals within the empty electrical slots are disadvantageously susceptible to corrosion, which may affect the performance of the DIMMs once they are inserted into the empty slots. Therefore, a need exists for a way to provide capacity to expand memory while avoiding the susceptibility to corrosion or other damage.

The various electrical components located on the backplane and cards (for example, the DIMMs on the memory riser card) tend to consume a substantial amount of electrical power, and therefore generate a substantial amount of heat. Because excess temperature can impair computer system reliability and functionality, computer systems are typically provided with one or more large, high-powered blowers that cause a cooling flow of air to pass through the cage, and over the various electrical components, thus causing a transfer of heat away from the electrical components.

However, the various electrical components generate different amounts of heat, depending on the amount of electrical power the respective electrical component consumes. In order to sufficiently cool the electrical components which generate the most heat, the size of the blower is typically dependent on the amount of air flow necessary to cool these highest powered electrical components. For example, if there is one electrical component on a processor card, for example, which requires 25 cubic feet per minute of cooling air to dissipate its generated heat, but the remaining electrical components only require 15 cubic feet per minute of cooling air to dissipate their generated heat, the blower must blow at least 25 cubic feet per minute over all the electrical components, so as to cool the electrical component on the processor card, i.e., the electrical component which generates the most heat. Thus, more cooling air than necessary is supplied to the other, lower powered electrical components. Therefore, a need exists for a cooling system which can provide the optimum required cooling air to each of the components without wasted capacity.

Because of their large outputs, the known blowers disadvantageously generate a substantial amount of noise, which requires bulky and expensive acoustic dampening material to be provided within the computer's housing. Moreover, these high-output blowers are typically relatively large, and disadvantageously take up a large amount of space within the computer housing. Further, high-output blowers are relatively expensive, as compared to low-output fans. Therefore, a need exists for a cooling system without these disadvantages.

A typical goal in the computer industry is to create a computer system which has increased computing power in a smaller computer housing. For example, present low end deskside or computer workstations have capabilities which meet or exceed those capabilities of high end systems developed for business use only a few years ago. However, as computer power increases, cooling demands increase, as described above. As computer size is decreased, it becomes necessary to make more efficient use of less and less space. Since the cooling capacity of a system is related to the volume of air which can be transported therethrough, the goal of increased computing power in decreased housing size presents challenges to system designs. Further, today's low end computer market is highly cost competitive. Therefore, a need exists for an inexpensive, high performance, compact deskside computer system.

SUMMARY OF THE INVENTION

It is, therefore, a principle object of this invention to provide an enhanced circuit board arrangement for a computer.

It is another object of the invention to provide an enhanced circuit board arrangement that solves the above mentioned problems.

These and other objects of the present invention are accomplished by the circuit board arrangement disclosed herein.

According to one aspect of the invention, a clock card is attached to a rear surface of a backplane, and a plurality of circuit boards are attachable to a front surface of the backplane. This placement advantageously moves the clock card, which does not usually require easy access, to a relatively inaccessible portion of a computer, and provides more usable front surface area of the backplane for attachment of processor and/or memory riser boards. This allows for a reduction in the overall size of the backplane, thus reducing the cost and size of the computer system.

According to a further aspect of the invention, the clock card may be arranged parallel to the backplane, in order to advantageously reduce unusable space.

According to another aspect of the invention, mock electrical components are provided. The mock electrical components are located in electrical slots on a circuit board, and protect the electrical terminals within the slots from corrosion. Further, the mock electrical components imitate an operational electrical component from an air flow perspective.

According to a further aspect of the invention, a cage is provided which accommodates the backplane, the circuit boards, and the clock card. Advantageously, the cage is divided into a plurality of discrete cooling zones, each being separated from the others by physical barriers. This arrangement advantageously allows for the transfer of heat from the various electrical components located on the backplane, circuit boards and clock card, which would otherwise impair the computer system's reliability and functionality.

According to a yet another aspect of the invention, the walls of the cage are preferably provided with a plurality of air openings specifically configured and arranged, so that each cooling zone has its own discrete air inlet opening in one of the walls of the cage, and an air outlet opening in the other, opposite wall of the cage. These air openings allow for separate and discrete air flows to pass through the respective cooling zones, so as to transfer any generated heat away from the electrical components.

Additionally, according to another aspect of the invention, the air openings are sized to allow the proper flow of cooling air to pass therethrough, and are arranged so that the flow of air passes directly around the electrical component to be cooled. By sizing the air openings to accommodate the varying needs of the electrical components, only the proper flow of cooling air will be allowed to pass therethrough, with the flow of air passing directly around the electrical component to be cooled.

According to a further aspect of the invention, large openings can be formed in the walls of the cage and in registration with the respective cooling zones, which are then partially covered using individual slide-in elements. The slide-in elements have the inlet and outlet configurations pre-formed therein, and can be easily changed to match the particular configuration of the electrical components. This may be particularly advantageous when adding extra electrical components, which may then require more cooling air to dissipate their generated heat.

Additionally, according to another aspect of the invention, the cage is arranged within a housing, with one wall of the cage being isolated from the other wall of the cage using, for example, a fin on the upper panel of the cage, so that the outer portion of each wall is located in separate air spaces. In order to generate the flows of cooling air through the cage, a gas moving device, such as a fan, is provided in one of the air spaces, for example, in a region near the air inlets. This arrangement assists in reducing the total air flow needed to cool the electrical components. As such, the fan can be of a smaller and less expensive design. Moreover, since the fan is smaller, less room is needed to house the fan, so that the overall size of the computer is reduced. Further, the smaller fan tends to operate much more quietly than the known blowers used in the conventional arrangements, so less acoustical dampening material is needed to muffle the sound of the fan. This further reduces the size, cost and weight of the computer.

According to another aspect of the invention, although the cooling gas is typically ambient air, the cooling gas is not limited as such. Other cooling gasses may also be used, as will be appreciated by one skilled in the art.

According to yet a further aspect of the invention, a method of cooling an electrical component is proposed. The method advantageously provides for a less expensive and smaller enclosure, which can be located within a computer.

In yet a further aspect of the invention, a method of impeding a flow of cooling gas over a surface of a circuit card is proposed, which allows the cooling requirements of the circuit card to be predetermined.

In another aspect of the present invention, a method of increasing a usable surface area of a backplane is proposed, which helps reduce the cost of the backplane.

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Figure 1:
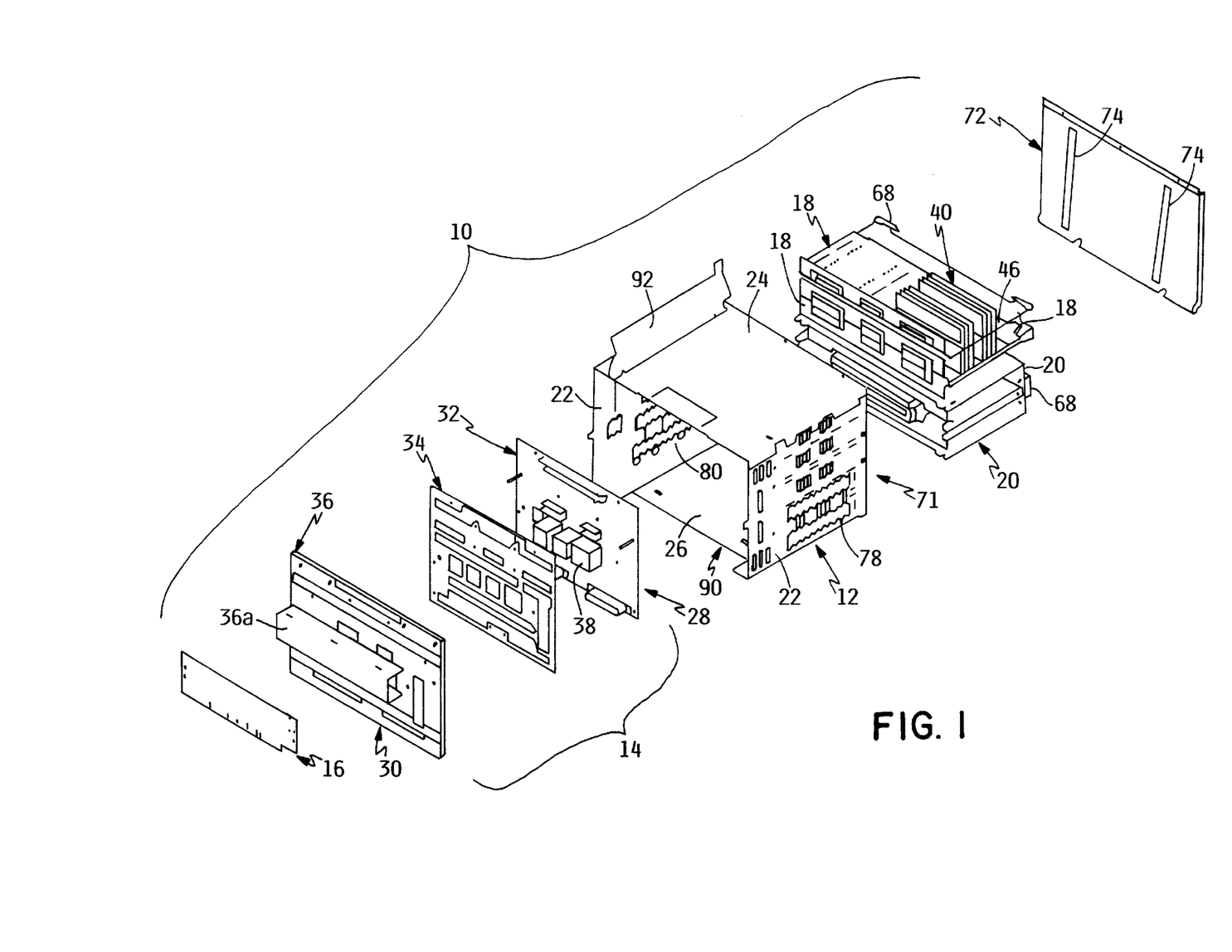
FIG. 1 is a perspective, exploded illustration of a central electronics complex, according to an exemplary embodiment of the invention.

FIG. 1 illustrates an exemplary embodiment of the invention applied to a so-called central electronics complex 10 (CEC) of a computer system. The CEC is comprised of an enclosure (such as a cage 12), a backplane 14, and a plurality of circuit boards, such as a clock card 16, memory riser card 18 and a processor card 20, attachable to the backplane 14.

As shown, the cage 12 has a box shape with a generally rectangular cross-sectional profile, and is formed of two, generally upright, spaced apart walls 22 joined together by upper and lower parallel panels 24, 26. The walls 22 and panels 24, 26 define a space within the cage 12, which can be accessed through front and rear openings in the cage. The cage 12 is dimensioned to accommodate the backplane 14, memory riser card 18 and processor card 20, as will be subsequently described. Moreover, the cage 12 is preferably comprised of sheet metal, which can be easily manipulated to form the walls 22 and panels 24, 26, although other materials, such as plastic, may also be used. The overall dimensions are such that the computer system CEC is essentially of the "deskside" size. However, the invention is not limited to deskside-sized enclosures, and is applicable to a variety of different sizes.

The backplane 14 is a generally planar, rectangular structure, having front 28 and rear 30 major surfaces, and is accommodated within the cage 12 so that its major surfaces are essentially perpendicular to the walls 22 and panels of the cage 12. Preferably, the backplane 14 is comprised, for example, of a printed circuit board 32 (PCB), an insulator panel 34, and a stiffener panel 36 layered together. The printed circuit board 32 of the backplane 14 may have an electrical component attached to a surface thereof, such as a memory control unit 38 for the CEC 10. Memory control unit 38 serves as the hub of the CEC 10, i.e., the circuit boards 18, 20, and clock card 16 are electrically connected to the memory control unit 38 through the backplane 14.

Advantageously, the clock card 16 is attached to the rear surface 30 of backplane 14, and the plurality of circuit boards 18, 20 are attachable to the front surface 28 of the backplane 14. As noted, the backplane 14 is one of the more expensive components of a computer system, with the cost of the backplane being proportional to its size. This arrangement according to the invention reduces the size of the backplane 14 over the known backplane arrangements, while still allowing a plurality of circuit boards 18, 20 to be attached to the front surface 28 of the backplane 14. Since the clock card 16 is typically used only for system operation, is usually highly reliable, and is generally only removed when defective, easy access is unnecessary. Further, the clock card 16 may be arranged parallel to the backplane 14, in order to advantageously reduce unusable space.

The memory riser card 18 and the processor card 20 are likewise generally planar, rectangular structures which, when installed in the cage 12, are essentially parallel to the panels 24, 26 of the cage 12, and essentially perpendicular to the major surfaces 28, 30 of the backplane 14, although other orientations may be possible. The cards 18, 20, are electrically connected to the printed circuit board 32 of the backplane 14, preferably by way of corresponding sockets (not shown) located on a front surface of the printed circuit board 32 so as to be essentially perpendicular to the backplane 14.

As illustrated, the backplane 14 is adapted to receive and electrically interconnect a plurality of memory riser cards 18, and a plurality of processor cards 20. For example, the illustrated backplane 14 is adapted to receive up to three memory riser cards 18, and up to two processor cards 20.

In this example, each memory riser card 18 has a generally rectangular shape, and is, for example, 5.5 inches by either 14.6 or 15.1 inches. Further, each memory riser card 18 can accommodate a plurality of electrical components, for example, up to sixteen Dual In-Line Memory Modules 40 (DIMMs). The DIMMs 40 can be easily added to the memory riser card 18 as the computer memory needs of the user change.

Figure 2:
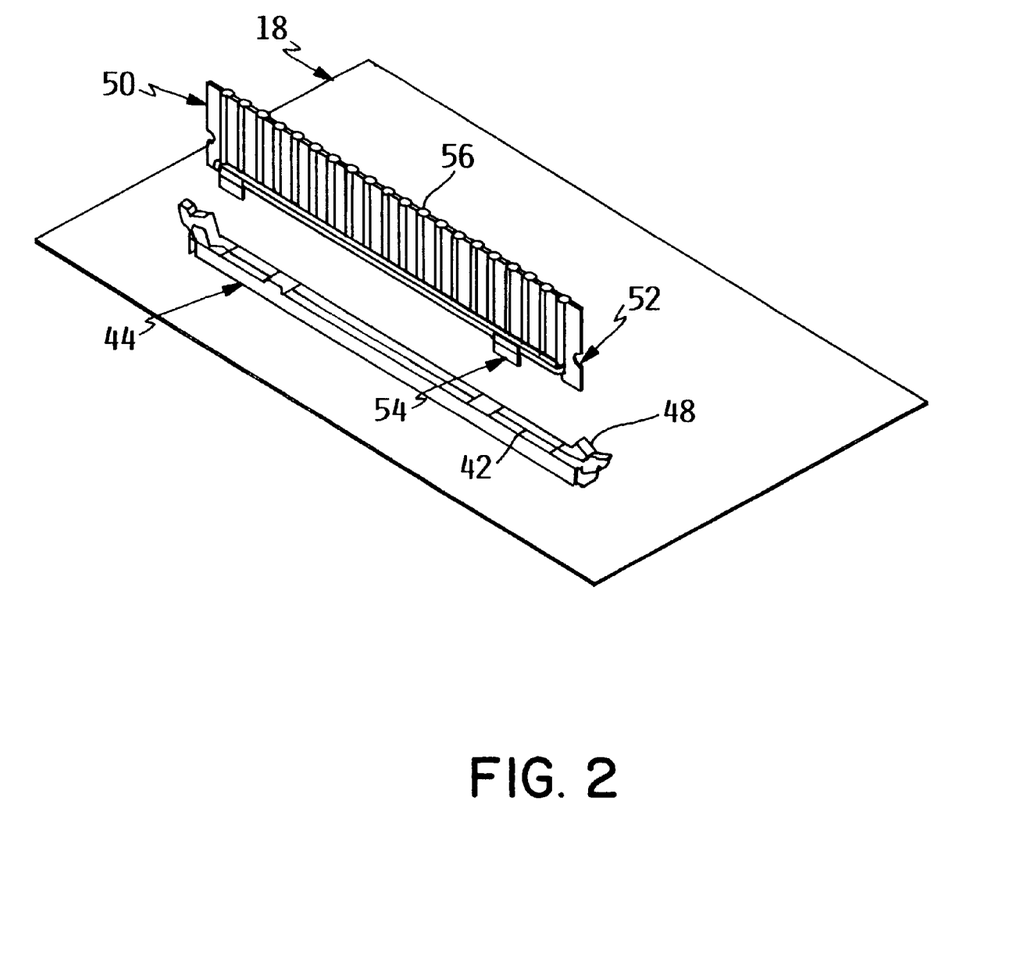
FIG. 2 is a perspective view of a filler DIMM, according to an exemplary embodiment of the invention.

Referring also to FIG. 2, each DIMM 40 is received within a slot 42 of a respective electrical connector 44, which is located on a surface of the memory riser card 18. The side edges of the DIMMs 40 may be provided with retention devices 46, which engage with cam latches 48 provided on the electrical connectors 44. The cam latches 48 help pull the DIMMs 40 into the respective electrical connectors 44, and hold the DIMMs 40 in place.

According to one aspect of the invention, at least one mock electrical component may be provided, as best shown in FIG. 2. As will be appreciated, the memory riser cards 18 do not always have all of their electrical connectors 44 utilized. For example, although in this example each memory riser card 18 can accommodate up to sixteen DIMMs 40, typically fewer than sixteen DIMMs 40 are originally provided. If the unpopulated electrical connectors 44 are left empty, dust may settle in the electrical connectors 44, which can reduce their reliability once the electrical connectors 44 are placed in service. To help protect these electrical connectors 44, a mock electrical component, for example, a filler DIMM 50, may be provided. The filler DIMM 50 is similar in size and shape to an actual DIMM 40 (for example, rectangular in shape, with a length of 6.05 inches, and a height of 1.15 inches). As such, the filler DIMM 50 will impede an air flow over the respective memory riser cards 18 in the same manner as an actual operational DIMM 40, and may be located within the unused electrical connectors 44 until they are needed. Advantageously, the filler DIMM 50 additionally prevents dust from settling in the electrical connectors 44, ensuring that the electrical connectors 44 will properly operate when placed in service. The filler DIMMs 50 may be comprised of an anti-static plastic, and be provided with retention devices 52 in the upper body of the filler DIMM 50, in a manner similar to an operational DIMM 40. Further, the base of the filler DIMM 50 may be provided with stabilizing tabs 54, which grip opposite sides of the electrical connector 44 when the filler DIMM 50 is installed. The stabilizing tabs 54 help maintain the position of the installed filler DIMMs 50. Moreover, the filler DIMM 50 may have a plurality of parallel ribs 56 thereon, which extend from the base of the filler DIMM 50 to its upper edge. The ribs 56 add rigidity to the filler DIMM 50, and provide a surface which allows for a better grip when removing the filler DIMM 50 from the electrical connector 44.

Figure 3:
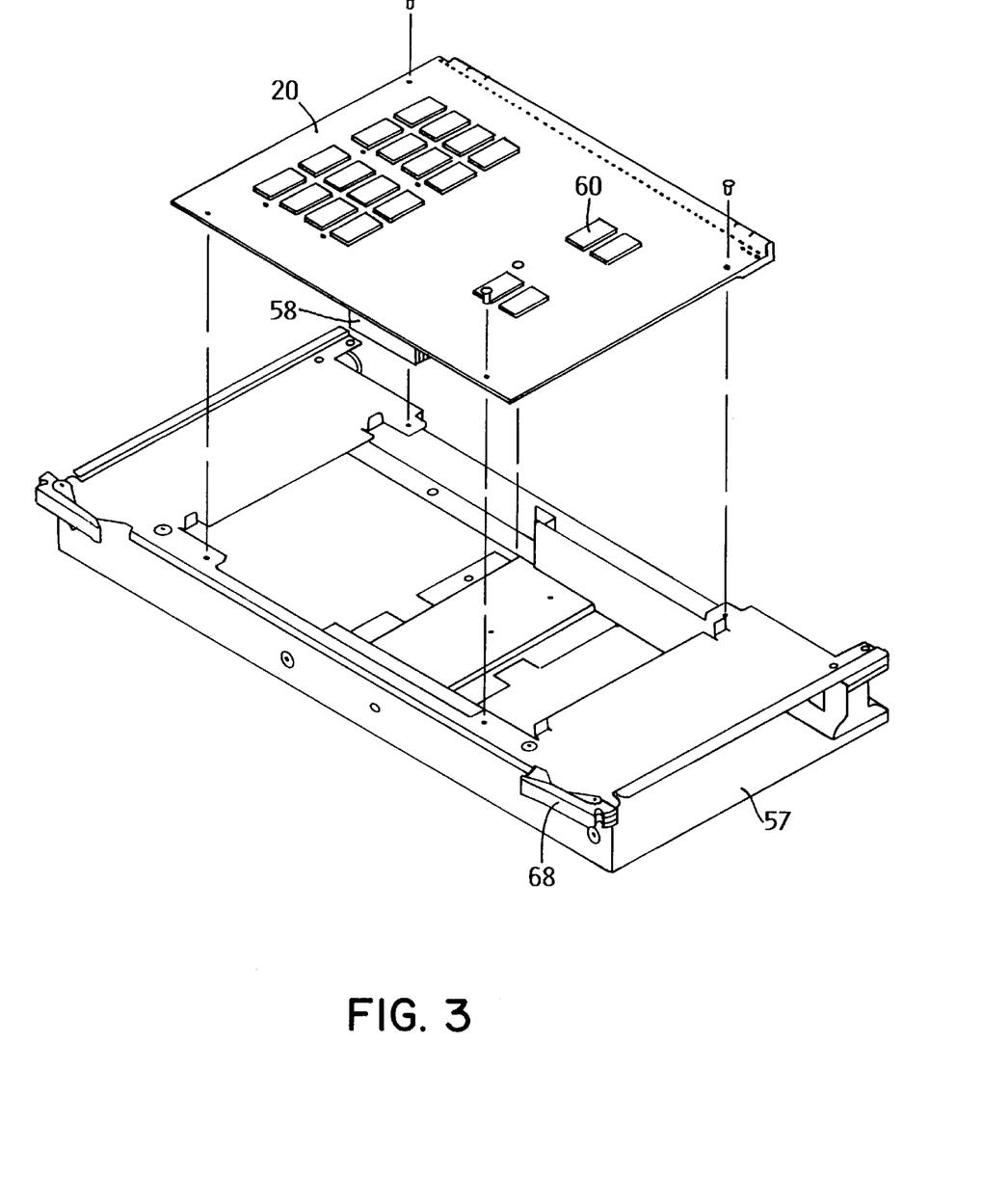
FIG. 3 is a perspective, exploded view of a processor book and processor card, according to an exemplary embodiment of the invention.

Referring also to FIG. 3, the processor cards 20 can be, for example, located within a processor book 57, such as are described in related co-pending application attorney docket IBM-106, referenced above, although such placement is not required. In this exemplary embodiment, the processor card 20 has a rectangular shape, and is, for example, 8 inches in length by 7 inches in height. Preferably, each processor card 20 can, for example, support one or more processor modules 58. The user thus can select from, for example, three different processor configurations (i.e., two processor cards 20 with one processor module 58 each; two processor cards 20 with a plurality of processor modules 58 each; or one processor card 20 with one processor module 58 and one processor card 20 with a plurality of processor modules 58). The processor cards 20 may also have a memory cache 60 attached thereto, for example, by soldering the memory cache 60 to the processor card 20.

Figure 4:
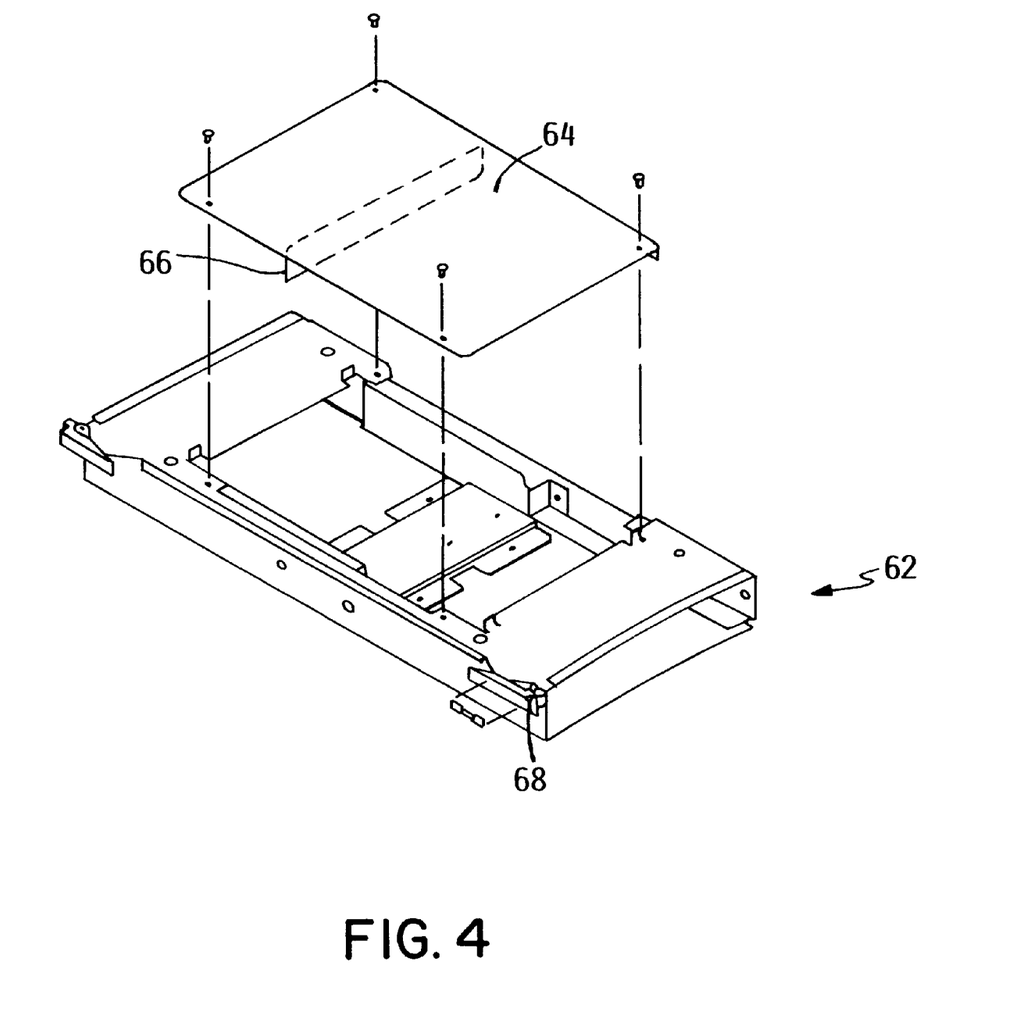
FIG. 4 is a perspective view of a processor filler book, according to an exemplary embodiment of the invention.

Occasionally, it may be desirable to provide, for example, only one processor card 20, even though the backplane 14 is adapted to receive, for example, two processor cards 20. In such a situation, a processor filler book 62 can be provided, which has a plate 64 located therein instead of a processor card 20, as shown in FIG. 4. The plate 64 includes a baffle thereon (partially shown using hidden lines), which can be, for example, a perforated plate 66 attached to a surface of the plate 64, so as to impede the air flow in the same manner as an operational processor card 20, as will be subsequently explained.

Preferably, each circuit board 18, 20 (or alternatively, the processor book 57 in which the processor card 20 is located) includes two cam-action latches 68, which engage with the edges of the walls 22 of the cage 12. The latches 68 provide leverage for plugging and unplugging the circuit boards 18, 20 to the backplane 14.

Figure 5:
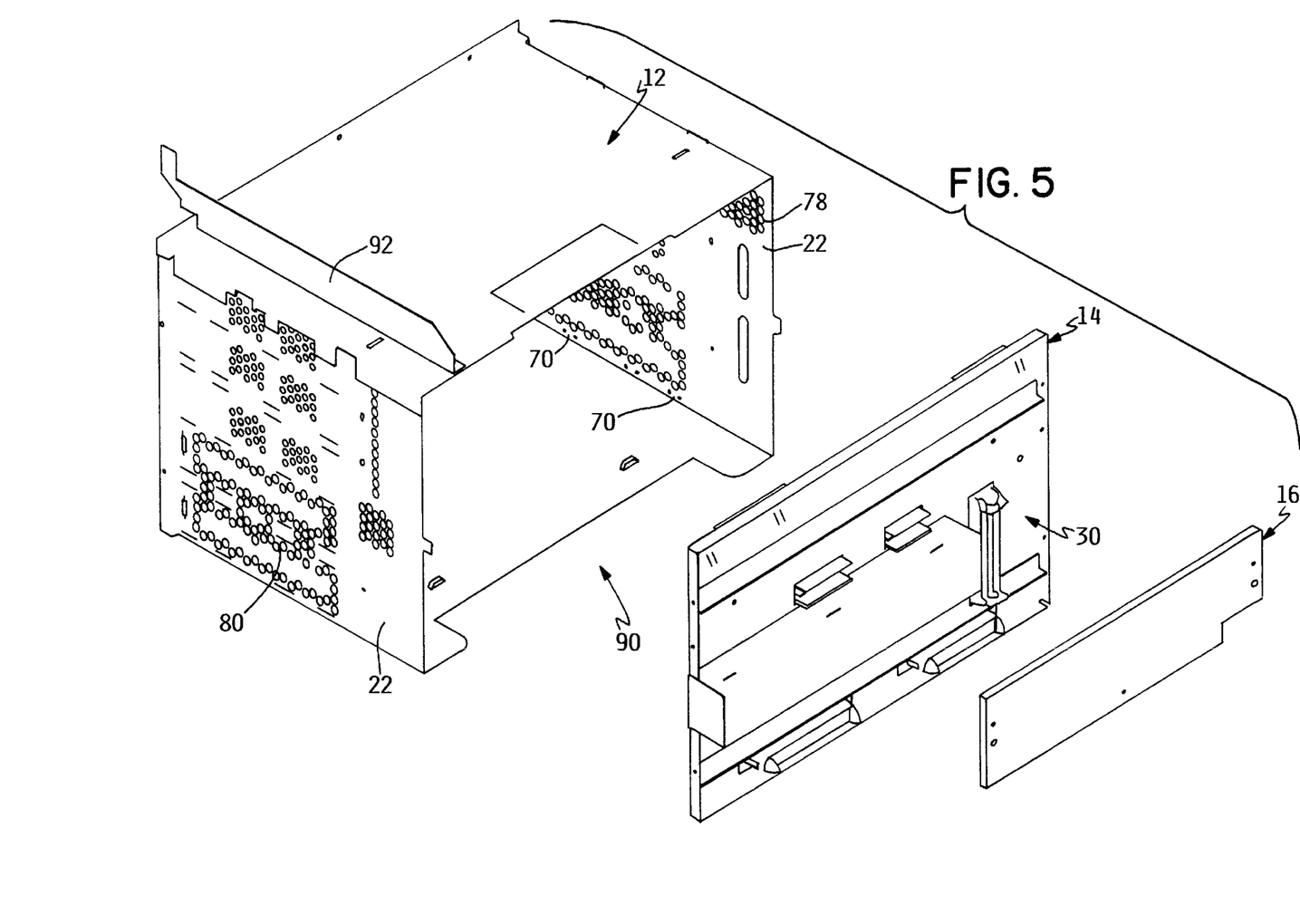
FIG. 5 is a perspective, exploded view of a cage, backplane and clock card of the central electronics complex shown in FIG. 1.

As best shown in FIG. 5, the cage 12 may include a number of tabs 70 formed in the walls 22, which serve as guides for the circuit boards 18, 20 (not shown in this Figure). The outer edges of the circuit boards 18, 20 slide upon the tabs 70 when installing or removing the circuit boards from the cage 12, which helps ensure the circuit boards are properly orientated relative to the backplane 14. Moreover, the tabs 70 provide support for the circuit boards 18, 20 once installed, which helps stabilize the assembly.

As will be appreciated, since the circuit boards 18, 20 can be modified by the user, it is advantageous if the circuit boards are easily accessible. In order to accomplish this, the front opening 71 of the cage 12 is preferably provided with a cover 72 (as shown in FIG. 1), which when removed, allows the circuit boards 18, 20 to be removed from the cage 12. Preferably, the cover 72 is formed from sheet metal. This allows the cover 72 to be economically manufactured. Moreover, the sheet metal cage 12 and cover 72 collectively form an EMC (electromagnetic compatible) enclosure, i.e., an enclosure which allows the backplane 14, circuit boards 18, 20 and clock card 16 to be operated in an electromagnetic environment at an optimum level of efficiency, and which allows for static charges to be drained to the frame ground during the installation and removal of the processor cards 20 and memory riser cards 18.

Preferably, the cover 72 is provided with foam strips 74 which are in registration with respective ones of the circuit boards 18, 20, and in contact with the latches 48, 68. When the cover 72 is installed on the cage 12, the foam strips 74 press against the circuit boards 18, 20, urging the circuit boards 18, 20 toward the backplane 14, and holding the latches 48, 68 in their closed position. This helps to prevent fretting of the connector contacts between the circuit boards 18, 20, and the backplane 14. As is known, fretting is a phenomenon in which surface damage occurs when metal contacts are subjected to micro-vibrations.

Figure 6:
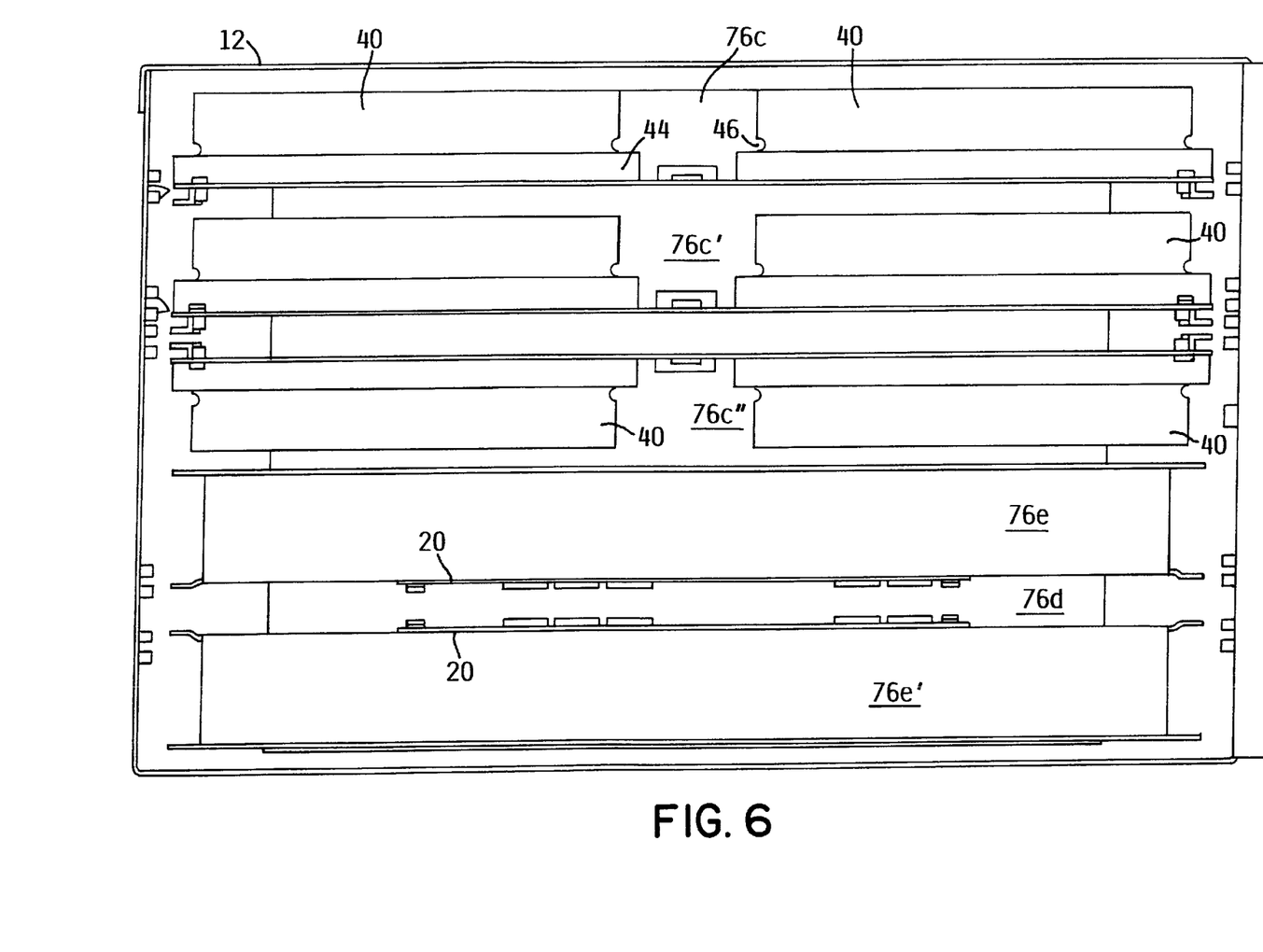
FIG. 6 is an end view of the cage shown in FIG. 5, illustrating the arrangement of the circuit boards, and the cooling zones.
Figure 7:
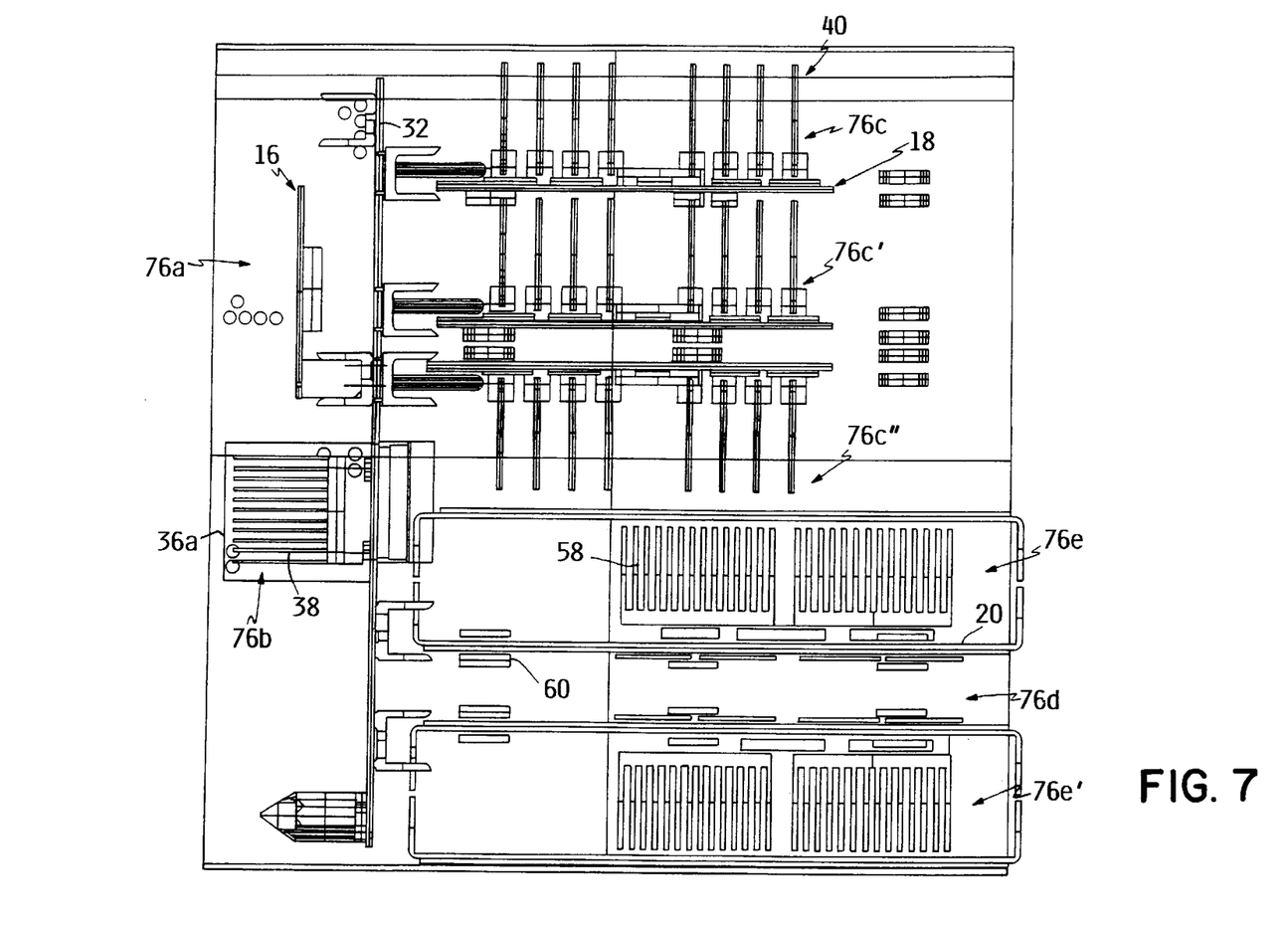
FIG. 7 is a side view of the cage shown in FIG. 5, illustrating the arrangement of the various boards and components within the cage, and the cooling zones.

As noted earlier, the cage 12 accommodates the backplane 14, the circuit boards, and the clock card 16. Preferably, the cage 12 is divided into a plurality of discrete cooling zones 76a–76e, each being separated from the others by physical barriers, as best shown in FIGS. 6 and 7. As was previously mentioned, the various electrical components located on the backplane 14, circuit boards 18, 20 and clock card 16 tend to consume a substantial amount of electrical power, and therefore generate a substantial amount of heat. Because excess temperature can impair a computer system's reliability and functionality, the generated heat should be removed from the cage 12. This exemplary embodiment provides for a cooling arrangement which removes the generated heat. For example, in this exemplary embodiment, the cage 12 is provided with separate cooling zones for the memory control unit 38 on the printed circuit board 32 of the backplane 14, the clock card 16, each of the memory riser cards 18, each of the processor cards 20, and the memory cache 60 attached to the processor cards 20.

By separating each cooling zone 76 from the other cooling zones, intermixing of the cooling air is minimized. For example, the cooling zone 76a for the clock card 16 can be separated from the adjacent cooling zone 76b for the memory control unit 38 using a cover member 36a of the stiffener panel 36 of the backplane 14. Further, the cooling zone 76b for the memory control unit 38 can be separated from the cooling zones 76c–76e for the various circuit boards 18, 20 and the memory cache 60 using the printed circuit board 32 of the backplane 14. Additionally, each of the cooling zones 76c, 76c', 76c" for the memory riser cards 18, the cooling zone 76d for the memory cache 60, and the cooling zones 76e and 76e' for the processor modules 58 can be separated from one another using the respective circuit boards as barriers. Alternatively, supplemental barriers can be provided (not shown) to separate the cooling zones from one another.

In order to further reduce cooling air leakage from one cooling zone to the next, insulating strips of, for example, foam (not shown) may be provided around the periphery of the various circuit boards, etc., to seal any air gaps between the edges of the circuit boards 18, 20, clock card 16 and backplane 14, and the cage 12. However, since the cooling air will flow along the path of the least resistance, absolute sealing between the cooling zones is unnecessary, due to the provision of precisely configured air openings 78, 80 in the walls 22 of the cage 12, as will be described in the subsequent paragraphs.

The walls 22 of the cage 12 are preferably provided with a plurality of air openings 78, 80 specifically configured and arranged, so that each cooling zone 76a–76e has its own discrete air outlet opening 78 in one of the walls 22 of the cage 12, and an air inlet opening 80 in the other, opposite wall 22 of the cage 12. These air openings 78, 80 allow for separate and discrete air flows to pass through the respective cooling zones 76a–76e, so as to transfer any generated heat away from the electrical components. Further, each respective opening can be comprised, for example, of a plurality of perforations arranged in a predetermined pattern.

Preferably, the air openings 78, 80 are sized to allow the proper flow of cooling air to pass therethrough, and are arranged so that the flow of air passes directly around the electrical component to be cooled. As was previously mentioned, the various electrical components generate different amounts of heat, depending on the amount of electrical power the respective electrical component consumes. For example, the processor cards 20 may require 25 cubic feet per minute (CFM) of cooling air to dissipate their generated heat, whereas the memory riser cards 18, with all of their electrical connectors populated by either filler DIMMs 50 or operational DIMMs 40, may only require 20 CFM of cooling air to dissipate their generated heat. Further, the memory control unit 38 on the printed circuit board 32 may require as little as 5 CFM of cooling air. By sizing the air openings 78, 80 to accommodate these varying needs, the proper flow of cooling air will be allowed to pass therethrough, with the flow of air passing directly around the electrical component to be cooled. For example, and as shown in the Figure, each opening into the respective cooling zones for the memory riser cards 18 may be comprised of a plurality of perforations formed in the walls 22 in a square pattern, and be arranged directly inline with the DIMMs 40 to be cooled. On the other hand, the processor cards 20 generally require a larger flow of cooling air, so the openings into the cooling zones for the processor cards 20 may each be comprised of a plurality of perforations arranged in a relatively large, rectangular shape. Of course, other shapes and configurations for the openings are possible. For example, instead of a plurality of perforations arranged in a pattern, each opening can be single perforation of the desired size and shape.

The configuration of the openings 78, 80 can advantageously be predetermined, especially if the unused electrical connectors 44 on the memory riser card 18 are populated with filler DIMMs 50, and any unused processor card slots are filled with processor filler books 62. In such a situation, the flow impedance caused by the various components can be predetermined, and the overall flow of air through the cage 12 can be precisely and predeterminedly balanced.

Figure 8:
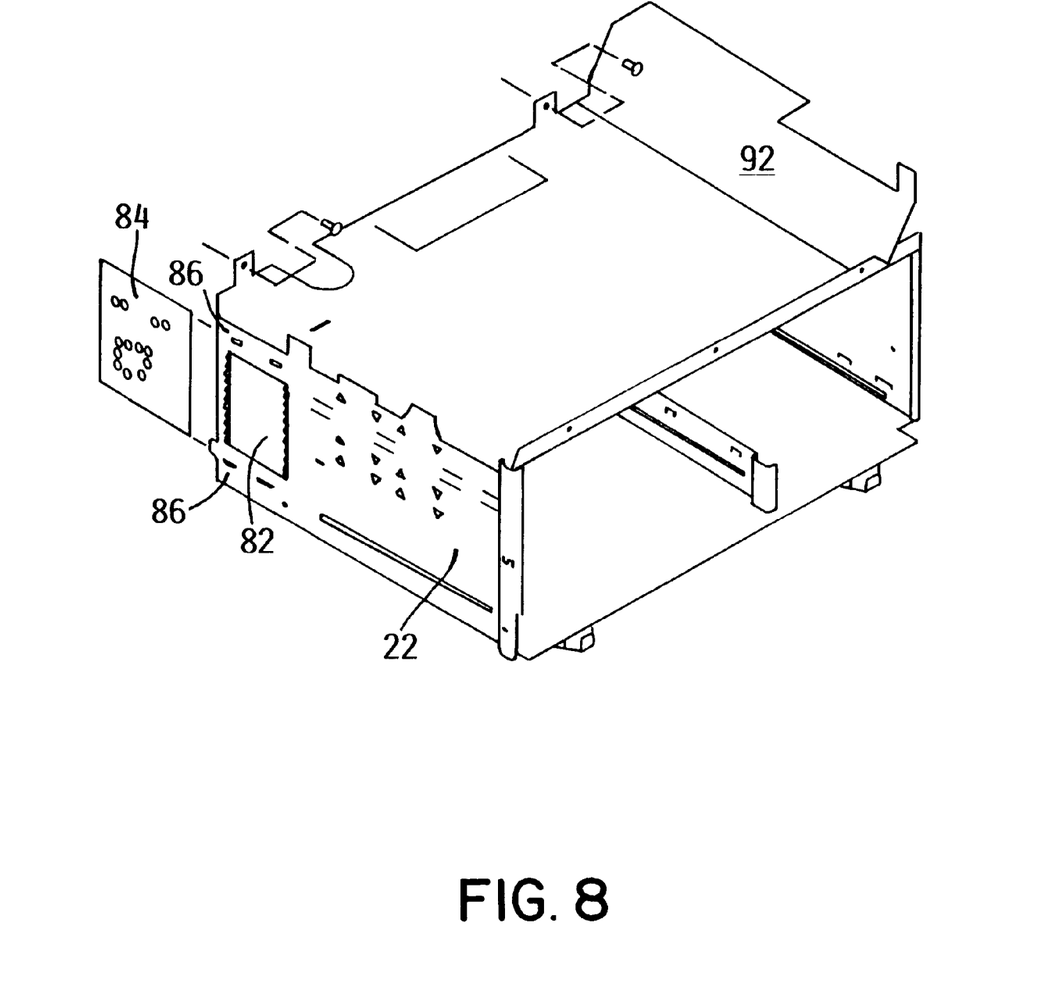
FIG. 8 is a perspective view of an alternative exemplary embodiment of a cage, according to the invention.

The openings for each respective cooling zone 76a–76e are typically the same configuration for both the outlet 78 (all of which are located on one common wall of the cage 12) and the inlet 80 (all of which are located on the opposite wall of the cage 12), although this is not required. Moreover, the openings 78, 80 can be easily formed in the walls 22 merely by perforating the sheet metal of the cage 12. Alternatively, and referring briefly to FIG. 8, large, generically-sized openings 82 can be provided in the walls 22 and in registration with the respective cooling zones, which can then be partially covered using individual slide-in elements 84, which engage with guides 86 formed in the respective walls 22 of the cage 12. In the Figure, opening 82 is formed from a single perforation located within wall 22. Alternatively, opening 82 can be formed of a plurality of perforations (not shown) arranged in a predetermined pattern. The slide-in elements 84 have the inlet and outlet opening configurations pre-formed therein, and can be easily changed to match the particular configuration of the electrical components. This may be particularly advantageous when adding extra DIMMs 40, for example, which may then require more cooling air to dissipate their generated heat.

Figure 9:
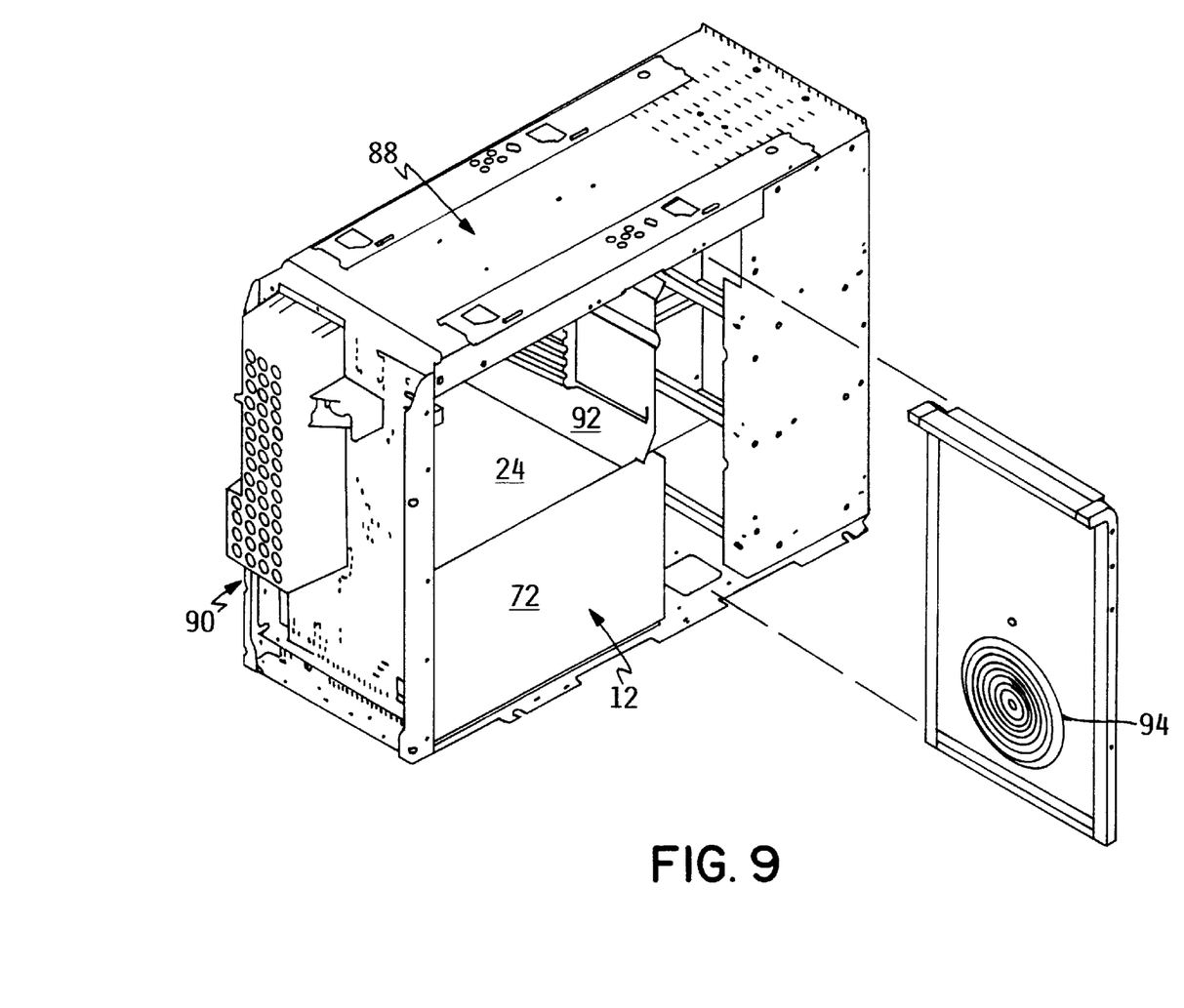
FIG. 9 is a perspective view of the central electronics complex shown in FIG. 1 arranged within a computer housing.

Referring also to FIG. 9, the cage 12 is arranged within a housing 88, with a rear opening 90 of cage 12 preferably being in contact with an inside wall of housing 88, so that the rear opening 90 is closed off. Further, one wall 22 of the cage 12 is isolated from the other wall 22 of the cage 12 using, for example, a fin 92 on the upper panel 24 of the cage 12, so that the outer portion of each wall 22 is located in separate air spaces.

In order to generate the flows of cooling air through the cage 12, a gas moving device, such as a fan 94, is provided in one of the air spaces, for example, in a region near the air inlet openings 80. The fan 94 can generate an increased pressure area, which will cause the cooling air to be forced through the air inlet openings 80 and respective cooling zones 76a–76e, and out through the air outlet openings 78. Alternatively, the fan 94 can be in the other air space, i.e., in a region of the air outlet openings 78. The fan 94 can be used to evacuate the air within the air space, creating a reduced pressure area, which causes the air to be drawn from the other air space, through the air inlet openings 80 and respective cooling zones 76a–76e, and out through the air outlet openings 78. Other arrangements of the fan 94 may also be possible. As will be appreciated, the total air flow required using the present invention is reduced compared to the prior art cooling arrangements. As such, the fan 94 used for creating the air flow can be of a smaller and less expensive design. Moreover, since the fan 94 is smaller, less room is needed to house the fan 94, so that the overall size of the computer is reduced. Further, the smaller fan 94 tends to operate much more quietly than the known blowers used in the conventional arrangements, so less acoustical dampening material is needed to muffle the sound of the fan 94. This further reduces the size, cost and weight of the computer.

Although air has been used by way of example as the cooling gas, other cooling gasses may also be used, as will be appreciated by one skilled in the art.

It should be understood, however, that the invention is not necessarily limited to the specific arrangement and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes, and adaptations, and the same are intended to be comprehended within the meaning and range of equivalents of the appended claims.

What is claimed is:

1. An arrangement, comprising:
   a backplane including a single, discrete printed circuit board having front and rear surfaces,
   a first circuit board comprising a computer clock card attached and arranged essentially parallel to the rear surface of said single printed circuit board, and
   at least one connector disposed on the front surface of said single printed circuit board for receiving a second circuit board, the second circuit board being essentially perpendicular to the front surface of said printed circuit board when received by said connector.

2. A cooling arrangement, comprising:
   an enclosure having:
      a first discrete wall,
      a second discrete wall positioned away from said first wall, said first and second walls collectively defining an interior of said enclosure, and
      a plurality of barriers within the interior and dividing the interior of said enclosure into a plurality of physically separated cooling zones,
      said barriers comprising a backplane having a front major surface, at least one circuit board attached to, and being essentially perpendicular to, the front major surface of said backplane, and a system operation card attached to, and being essentially parallel to, a rear major surface of said backplane.
      wherein said first wall having a plurality of inlet openings and said second wall having a plurality of outlet openings, each cooling zone having at least one electrical component therein, and being in registration with respective inlet and outlet openings so as to allow a cooling gas to pass through the respective cooling zones, the inlet and outlet openings being sized so that the cooling zones receive a predetermined amount of cooling gas sufficient to cool the respective electrical components located therein and so at least one cooling zone receives a different amount of the cooling gas than another one of the cooling zones,
      and wherein each barrier has respective ones of the electrical components attached thereto.

3. The arrangement of claim 1, wherein said backplane further includes an insulator panel disposed adjacent to the rear surface of the printed circuit board, and a stiffener panel disposed adjacent to said insulator panel.

4. The arrangement of claim 1, wherein said backplane further includes a memory control unit attached to one of said front surface and said rear surface of said printed circuit board, wherein said computer clock card and the second circuit board are electrically connected to said memory control unit through wirings formed in the single printed circuit board.

5. The arrangement of claim 4, wherein the wirings formed in the single printed circuit board extend from the front surface to the rear surface by passing through the printed circuit board to electrically connect said computer clock card and the second circuit board to said memory control unit.

6. The cooling arrangement of claim 2, wherein said backplane includes wirings that extend from the front major surface to the rear major surface by passing through the backplane to electrically couple said system operation card and the circuit board together.

* * * * *